(12) United States Patent
Namgoong et al.

(10) Patent No.: US 6,356,748 B1
(45) Date of Patent: Mar. 12, 2002

(54) SPECTRUM CONTROL FOR DIRECT CONVERSION RADIO FREQUENCY RECEPTION

(75) Inventors: Won Namgoong, Stanford; Teresa H. Y. Meng, Portola Valley, both of CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/422,881

(22) Filed: Oct. 21, 1999

Related U.S. Application Data

(63) Continuation of application No. 08/896,826, filed on Jul. 18, 1997.
(60) Provisional application No. 60/022,533, filed on Jul. 19, 1996.

(51) Int. Cl.[7] .................................................. H04B 1/54
(52) U.S. Cl. ...................... 455/324; 455/323; 455/190.1
(58) Field of Search .............................. 455/324, 190.1, 455/313, 118, 131, 180.3, 323; 375/220, 224

(56) References Cited

U.S. PATENT DOCUMENTS

| | | | | |
|---|---|---|---|---|
| 4,811,359 A | * | 3/1989 | Nakajima et al. | 375/224 |
| 4,897,854 A | * | 1/1990 | Harris et al. | 375/286 |
| 4,910,628 A | * | 3/1990 | Minagawa et al. | 361/84 |
| 4,953,160 A | * | 8/1990 | Gupta | 370/494 |
| 5,003,621 A | * | 3/1991 | Gailus | 455/209 |
| 5,208,829 A | | 5/1993 | Soleimani et al. | 375/1 |
| 5,548,839 A | * | 8/1996 | Caldwell et al. | 455/313 |
| 5,606,317 A | | 2/1997 | Cloonan et al. | 341/58 |
| 5,715,281 A | | 2/1998 | Bly et al. | 375/344 |
| 5,734,966 A | * | 3/1998 | Farrer et al. | 455/63 |

* cited by examiner

*Primary Examiner*—William Korzuch
*Assistant Examiner*—Daniel Abebe
(74) *Attorney, Agent, or Firm*—Lumen Intellectual Property Services, Inc.

(57) ABSTRACT

A method and apparatus for passband communication using direct conversion avoids 1/f and DC-offset noises by shaping the spectrum of the signal so that it has little energy near zero frequency. After the receiver frequency down-converts the signal to baseband, it filters frequencies in the neighborhood of zero prior to demodulation. Since the spectrum of the signal was shaped by a coder prior to transmission so that it has little energy content near zero frequency, the filtering at the receiver eliminates 1/f and DC-offset noise without reducing significantly the energy of the desired information signal. After the noise has been filtered, the receiver demodulates and decodes the signal to recover the information signal. The coding can be based upon broadening of the amplitude range or the frequency range to create the required spectrum shaping.

7 Claims, 4 Drawing Sheets

SPECTRUM CONTROL FOR DIRECT CONVERSION RADIO FREQUENCY RECEPTION

This application is a continuation of U.S. patent application Ser. No. 08/896,826 filed Jul. 18, 1997, which claims priority from U.S. Provisional Patent Application No. 60/022,533 filed Jul. 19, 1996, which is incorporated herein by reference.

This invention was reduced to practice with support from ARPA contract number N65236-96-C-8608. The U.S. Government has certain rights in the invention.

FIELD OF THE INVENTION

This invention relates generally to radio frequency communications. More particularly, it relates to spectrum control of radio frequency signals and the reception of such signals by direct conversion receivers.

BACKGROUND

Recent interest in portable wireless communication systems has prompted much research in the design of efficient radio frequency (RF) receivers. The need for receiver portability, however, limits the available battery power, and consequently places severe constraints on the power consumption, physical size and weight of such devices. Miniature radio receivers dissipating low power, therefore, are highly desirable. This search for efficient RF receivers has resulted in a resurgence of interest in simplified architectures.

About 98% of existing RF receivers are based on the superheterodyne architecture, which is shown in its simplest form in FIG. 1. An antenna 20 couples to an RF signal and feeds it to an RF amplifier 22. The amplified RF signal is then converted to an intermediate frequency (IF) by mixing it with a signal produced by an offset local-oscillator 24. The resulting IF signal is then substantially amplified by an IF amplifier 26 and then shifted to baseband by mixing it with a signal from a second local oscillator 28. The baseband signal is then quantized in an analog-to-digital (A/D) converter 30 and demodulated by a digital signal processing (DSP) demodulator 32.

There are several disadvantages of the superheterodyne architecture which make it impractical for low-power implementation. In order for IF amplifier 26 to produce sufficient gain in the IF signal, it must contain IF filters biased at large currents, thereby causing substantial power dissipation. Furthermore, these IF filters require numerous passive components which can not be integrated onto a single chip with the rest of the receiver, adding to receiver size and cost. Another significant drawback of the superheterodyne architecture results from the symmetry in mixing the RF signal with the signal from offset local oscillator 24. In addition to the desired RF signal, this mixing produces undesired image signals at an intermediate frequency above or below the offset local oscillator frequency. Removing the image signals, however, requires a more complicated and expensive receiver design, e.g. a very selective and expensive analog RF filter, or two or more IF stages.

The direct conversion receiver architecture, shown in FIG. 2, avoids many of the above difficulties of the superheterodyne architecture. An antenna 34 couples to an RF signal and feeds it to an RF amplifier 36, as before. The amplified RF signal is then converted directly to baseband (hence the term "direct conversion") by mixing it with a signal produced by an offset local-oscillator 38. The resulting baseband signal is then substantially amplified by a baseband amplifier 40 and then quantized in an analog-to-digital (A/D) converter 42 and demodulated by a digital signal processing (DSP) demodulator 44.

Because the down-converted signal in the direct conversion design is centered at frequency zero, there is no image signal to be rejected. Consequently, the analog filtering problem can be easily handled. In addition, the direct conversion architecture relaxes the selectivity requirements of RF filters and eliminates all IF analog components, allowing for a highly integrated, low-cost and low-power receiver. Due to these and other potential advantages, direct conversion designs have been the subject of numerous recent publications. See, for example, Abidi, A., "Direct-Conversion Radio Transceivers for Digital Communications," in IEEE Journal of Solid-State Circuits, vol. 30, no. 12, December 1995; Wilson, J., et al., "A Single-Chip VHF and UHF Receiver for Radio Paging," in IEEE Journal of Solid-State Circuits, vol. 26, no. 12, December 1991; Cavers, J., et al., "Adaptive Compensation for Imbalance and Offset Losses in Direct Conversion Transceivers," IEEE Transactions on Vehicular Technology, vol. 42, no 4, November 1993; Estabrook, P., et al., "The Design of a Mobile Radio Receiver Using a Direct Conversion Architecture," in Proc. IEEE Vehicular Technology Conference, San Francisco, May 1989, pp. 63–72.

There are two serious and well-known problems associated with direct conversion designs, namely, 1/f noise and DC-offset noise. Both of these noise sources result in severe performance degradation, and, in particular, reduce the detectability of the transmitted signal. See, for example, Abidi, A., "Direct-Conversion Radio Transceivers for Digital Communications," in IEEE Journal of Solid-State Circuits, vol. 30, no. 12, December 1995; Estabrook, P., et al., "The Design of a Mobile Radio Receiver Using a Direct Conversion Architecture," in Proc. IEEE Vehicular Technology Conference, San Francisco, May 1989, pp. 63–72.

The 1/f noise (also known as flicker noise or pink noise) is an intrinsic noise phenomenon found in semiconductor devices, with a power spectral density inversely proportional to frequency. The coupling of 1/f noise with the received signal takes place primarily after down-conversion at the baseband amplifier 40 (FIG. 2) after the down-conversion. Since the baseband signal could be in the range of hundreds of microvolts rms, the 1/f noise comprises a substantial fraction of the signal power, resulting in large signal distortion. In a superheterodyne architecture, on the other hand, the IF signal is substantially amplified by IF amplifier 26 (FIG. 1). Since the IF frequency is high enough that 1/f noise is negligible, the 1/f noise then becomes relatively insignificant when the IF signal is translated to baseband.

The DC-offset noise is an offset voltage that appears in the signal spectrum at DC when an RF signal is converted directly to baseband. This offset value typically dominates the signal by as much as 50 to 100 times, and can substantially degrade the signal to noise ratio (SNR) if it is not removed. Furthermore, this offset voltage must be removed in the analog domain prior to sampling, because it would otherwise saturate the baseband amplifiers and require an A/D converter with an impractically large dynamic range.

The DC-offset noise arises from two major sources. The first source is transistor mismatch in the signal path between the mixer and the I and Q inputs of the detector. With careful circuit design, this effect could be largely minimized. The second cause of DC-offset occurs when the signal from local oscillator 38 (FIG. 2), which is at the same frequency as the RF signal, leaks from antenna 34 and reflects off an external object and self-converts to DC. This local oscillator radiation also interferes with other nearby receivers tuned at the same frequency. Since this radiation is generally many orders of magnitude stronger than the RF signal, this self-rectification and nearby interference introduce tremendous DC-offset noise after direct-conversion. Furthermore, the amount of DC-offset generated by the local oscillator radiation is difficult to predict since its magnitude changes with receiver location and orientation. Good circuit isolation techniques could reduce this effect to a certain extent, but it cannot be eliminated entirely.

Despite the potential benefits of direct conversion receivers, the serious 1/f noise and DC-offset noise problems described above have limited its development and widespread use. There are a few published methods, however, that propose to overcome some of the above mentioned problems with direct conversion. One approach, for example, is disclosed in D. Haspeslagh et al. "BBTRX: A baseband transceiver for zero IF GSM hand portable station", *Proc. of Custom IC Conf.*, San Diego, Calif., 1992, pp. 10.7.1–10.7.4. This paper describes an approach for removing the DC offset noise by averaging the digitized baseband signal over a window and subtracting an estimate of the DC-offset noise from the signal using a D/A converter and various extraneous analog components. This method is relatively successful in nulling out DC offset but the settling time of the offset subtraction circuit may cause loss of the first few symbols in a TDMA receiver. In addition, this method fails to adequately suppress the 1/f noise. Moreover, the complexity of this approach compromises primary potential benefits of direct conversion design, namely low power and low complexity.

Wilson, J., et al., "A Single-Chip VHF and UHF Receiver for Radio Paging," in *IEEE Journal of Solid-State Circuits*, vol. 26, no. 12, December 1991 describe an application of direct conversion design to paging. Direct conversion has proven practical in this case because paging uses very simple two-tone signaling, i.e. wideband frequency shift keying (FSK) modulation, with the resulting spectrum having little DC energy. Since most of the distortion described above are concentrated near DC, an analog DC-notch filter which is attainable by simple capacitive coupling allows most of the noise near DC to be removed with minimal distortion to the signal spectrum.

Although the simplicity of the pager application maintains the advantages of a direct-conversion architecture, simple two-tone signaling is not suitable for most RF communications applications since these applications require modulation schemes that are more spectrally efficient per dimension than wideband FSK. In these more efficient modulation schemes, the method of capacitively coupling the baseband signal before sampling fails because of the large signal-bearing spectrum near DC, and a notch filter at DC will remove significant portions of the signal.

OBJECTS AND ADVANTAGES

In spite of the potential advantages of direct conversion receiver design, their practical use has been very limited thus far due to the outstanding problems of 1/f noise and DC-offset noise. Accordingly, it is a primary purpose of the present invention to provide a general purpose method for overcoming the present problems associated with direct conversion RF signal reception. It is an object of the invention, therefore, to provide a direct conversion receiver that is simple in design, may be implemented with low power, and does not suffer from 1/f or DC offset noise.

SUMMARY OF THE INVENTION

Figure 6:
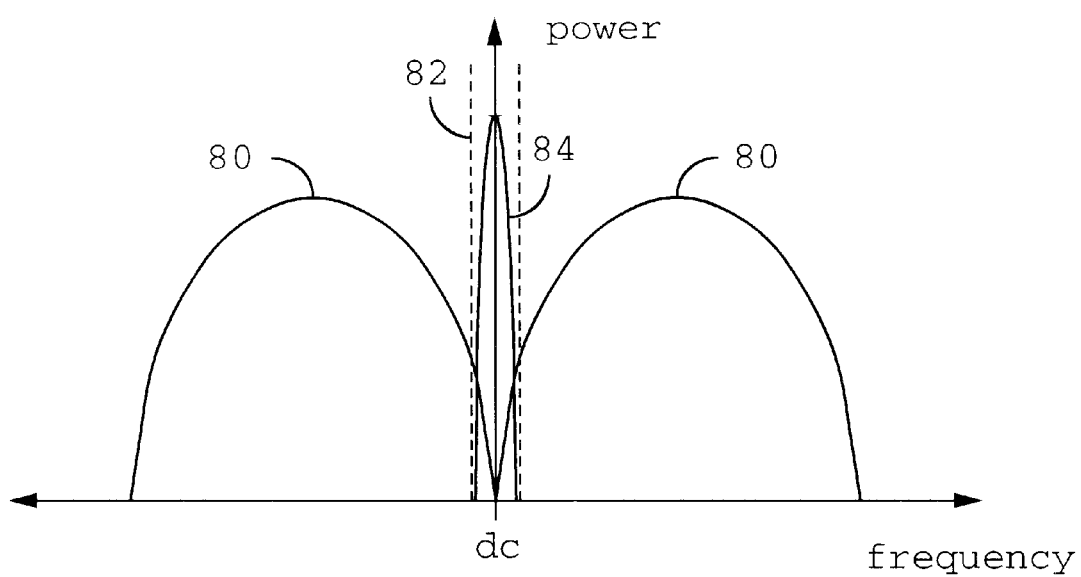
FIG. 6 is a graph of power vs. frequency showing a noise signal and a signal whose spectrum has been modified according to the invention.
Figure 7:
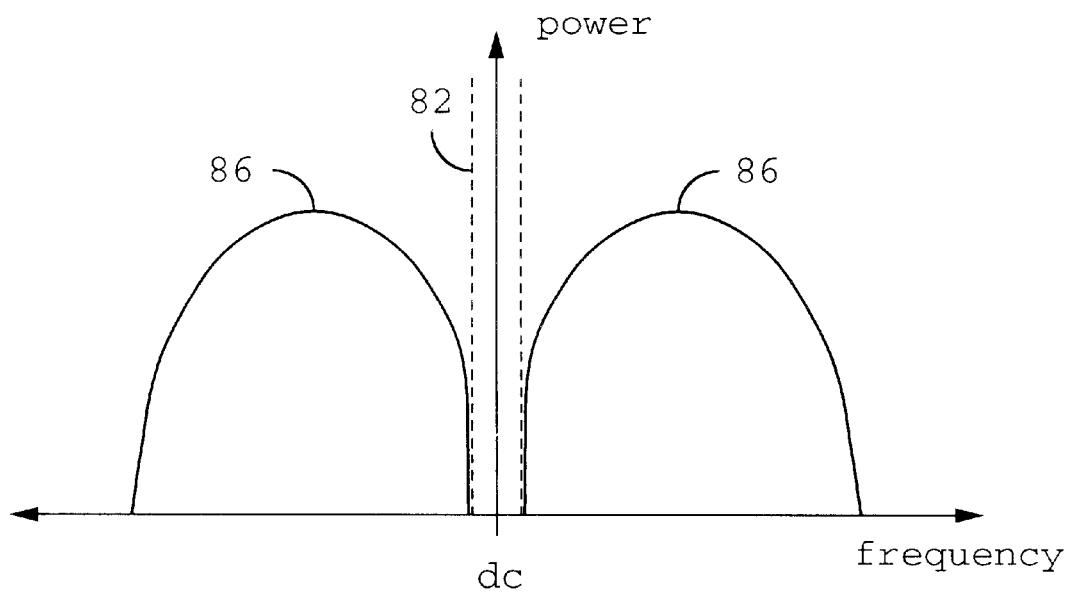
FIG. 7 is a graph of power vs. frequency for the signal shown in FIG. 6 after filtering according to the invention.

The present invention provides a method to minimize the effects of 1/f noise and DC-offset noise in a direct conversion receiver by modifying the energy spectrum of the signal at the transmitter such that negligible signal energy exists in a band 82 near DC, as shown in FIG. 6. In a preferred embodiment, the energy spectrum is modified to have a shape 80. Since the signal-bearing spectrum has few low frequency components, DC-offset and 1/f noise components 84 are easily filtered-out with little degradation to signal quality. FIG. 7 shows a signal 86 obtained from signal 80 (FIG. 6) by filtering low frequency components in a band 82 near DC. Notice that because the signal spectrum has been modified to contain little energy near DC, the DC offset noise and the 1/f noise 84 (FIG. 6) are filtered out while preserving almost all the energy of the original signal 80 (FIG. 6). Because the spectrum has been modified in a controlled manner, the original signal is recovered almost perfectly at baseband. This approach is general and could be applied to all existing modulation schemes.

Shaping the signal spectrum to minimize the energy content at low frequency is known in the context of baseband wired communication systems. The primary motivation in baseband systems for spectral control, however, is to overcome the attenuation introduced by the AC coupling inherent in transformers and broadband amplifiers. In passband systems such as wireless RF communications, on the other hand, attenuation is relatively constant across the narrow channel bandwidth. There is not an obvious motivation, therefore, for applying spectrum control techniques, as known in the context of baseband wired systems, to passband systems. Consequently, no one has previously suggested or recognized shaping a signal spectrum to minimize the energy content at low frequency before upconverting to passband for transmission. The present inventors, however, have recognized that by appropriately shaping the spectrum in RF communications, one can ensure that the transmitted passband signal has little energy near DC when converted to baseband in a direct-conversion receiver. Surprisingly, the 1/f and DC-offset noise near DC can then be removed with little distortion to the signal-bearing spectrum, overcoming the long-standing problems associated with direct-conversion receivers of the past.

In one aspect of the invention, a method and apparatus are provided for wireless or wired communication which benefits from the advantages of direct conversion reception while avoiding its traditional problems. At a transmitter the spectrum of an information signal is shaped to produce a coded signal having reduced energy at zero frequency. A high frequency carrier signal is then modulated in accordance with the coded signal according to any of various conventional signal modulation schemes. The modulated high frequency carrier signal is then transmitted over a communication channel and received at a receiver which down-converts the signal directly to baseband, producing a modulated baseband signal. A notch filter or other similar device at the receiver then reduces the energy of the modulated baseband signal in a frequency notch including zero, thereby eliminating 1/f and DC-offset noises. The receiver then demodulates and decodes the filtered signal to recover the original information signal.

This spectral shaping method is useful in any application where the transmitted signal can be modified. A useful application of the invention is to a wireless local area network (WLAN) In this application, computers or other electronic equipment are connected within an office using a wireless network. Using the method of the invention to shape the spectrum for direct conversion permits the use of greatly simplified receivers in the WLAN. Consequently, the network is cheaper, and the receivers are smaller and consume less power. It will be appreciated by anyone of ordinary skill in the art, however, that the present method would be immediately useful in any communication system which does not employ a transmission scheme fixed by present standards. Furthermore, if the present standards of communication systems (such as cellular telephone standards) are changed in the future, it is obvious that such systems would benefit from the methods of the present invention.

DETAILED DESCRIPTION

Although the present detailed description contains many specifics for the purposes of illustration, anyone of ordinary skill in the art will appreciate that many variations and alterations to the details are within the scope of the invention. Accordingly, the following embodiments of the invention are set forth without any loss of generality to, and without imposing limitations upon, the claimed invention.

Figure 1:
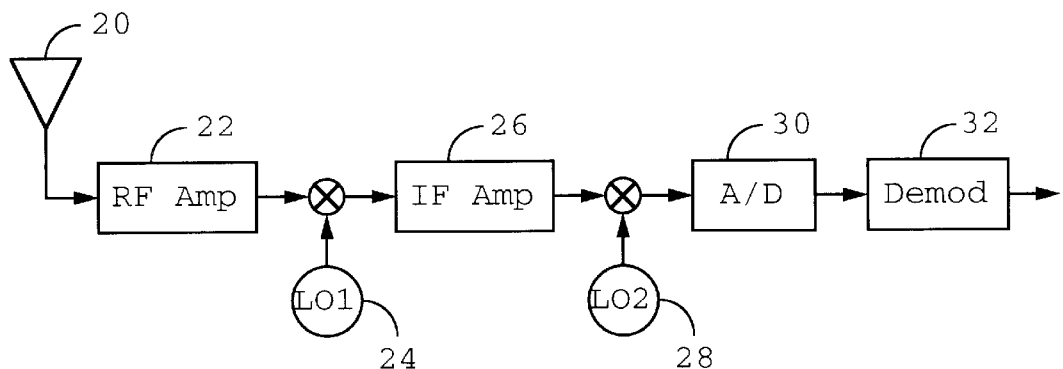
FIG. 1 is a block diagram of a conventional superheterodyne receiver well known in the art.
Figure 2:
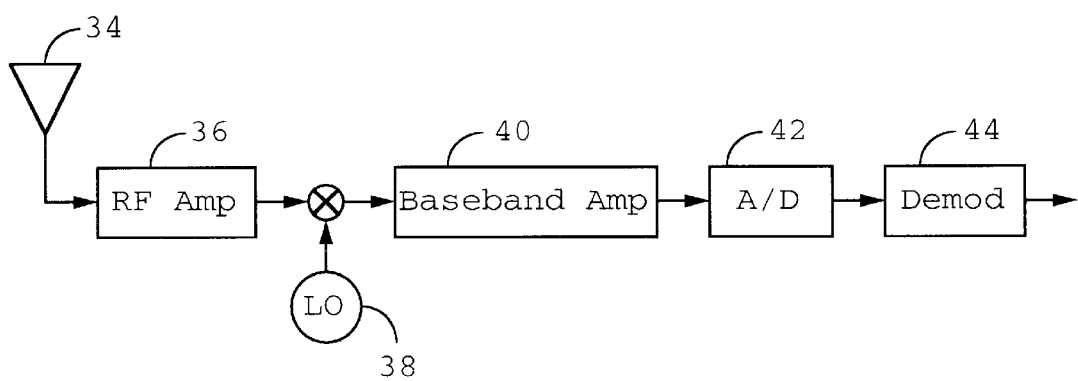
FIG. 2 is a block diagram of a typical direct conversion receiver well known in the art.
Figure 3:
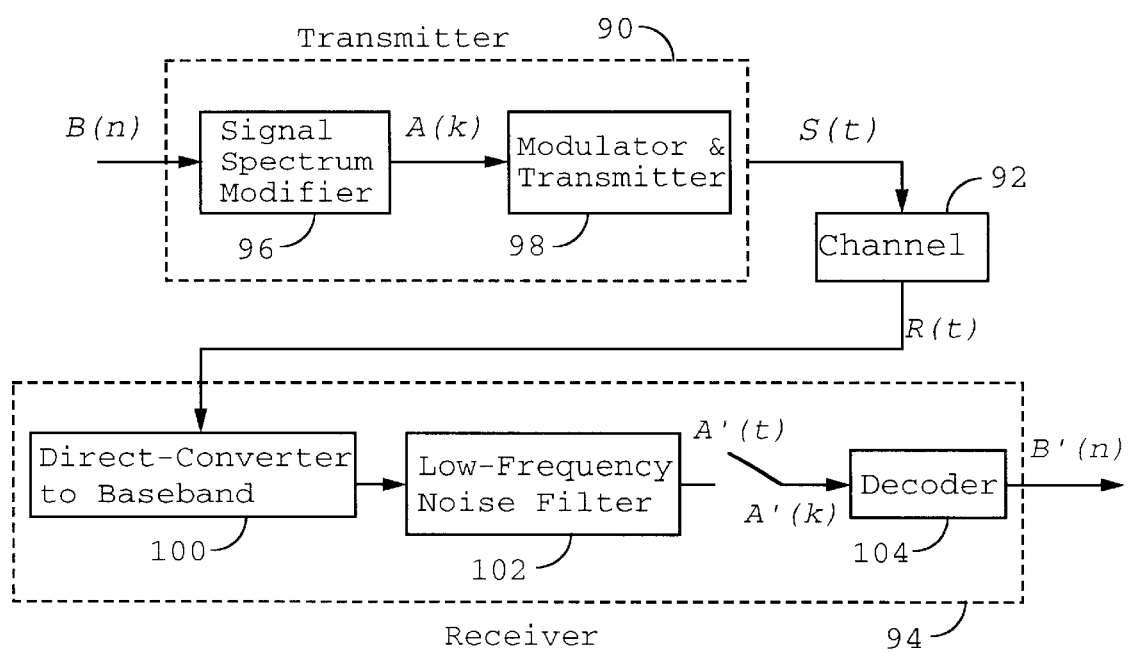
FIG. 3 is a block diagram of a preferred embodiment of the invention.

A block diagram of a preferred embodiment is shown in FIG. 3. A transmitter 90 generates an RF signal S(t) from a bit stream B(n). Signal S(t) passes through an RF channel 92 and is received as a signal R(t) by a receiver 94 which produces a received bit stream B' (n). Transmitter 90 contains signal spectrum modification circuitry 96 which modifies the spectrum of the bit stream B(n) so that it has negligible low-frequency components in a low-frequency band near DC, as shown in FIG. 6. A modulator and transmitter 98 then modulates the modified signal in accordance with any one of the many modulation schemes well known in the art, and transmits it over channel 92. At receiver 94 received RF signal R(t) is frequency shifted to baseband by a direct converter circuit 100. The down-converted signal is then filtered by a low-frequency noise filter 102 before sampling to produce signal A' (k). Filter 102 removes frequency components within a band 82 near DC, as shown in FIGS. 7 and 8. This low-frequency band should be wide enough to contain most of the DC-offset noise and 1/f noise 84 (FIG. 6). The low frequency energy components of the direct converted received signal should be removed in the analog domain prior to sampling, so that the DC-offset noise does not saturate the baseband amplifiers and require an impractically large dynamic range for the A/D converter. Since the frequency spectrum of the original bit stream B(n) was modified in a controlled manner at the transmitter to contain negligible low-frequency components in this low-frequency band, a decoder 104 can then recover a corresponding bit stream B' (n) from signal A' (k).

In the preferred embodiment, line coding is used to modify the signal spectrum of the incoming signal B(n), although it should be emphasized that any coding scheme or other technique that generates a signal power spectrum with little energy near DC could be used for direct conversion and is considered within the scope of the present invention. For purposes of illustration and enablement, the following description presents two possible types of coding techniques which may be used in an implementation of the present invention. One type of coding increases the number of signal levels, while the other increases the bandwidth. An example of the former is alternate mark inversion (AMI) code; an example of the latter is 3B4B code. AMI is pseudotertiary, that is, three amplitude levels are used to represent a single bit; 3B4B code, on the other hand, uses 4 bits to represent 3 bits. Codes with multilevels, codes with increased bandwidth, and other specific coding techniques all have their advantages and disadvantages depending on the particular application. For purposes of illustration, some tradeoffs associated with specific coding techniques are discussed below.

If an application of the present invention makes it desirable that the transmitted signal levels have constant amplitude, the spectrum can be shaped by using coding techniques that increase the bandwidth. For example, a 3B4B code can be used to modify the spectrum while keeping the amplitude constant in a direct conversion receiver. More generally, an mBnB line code can be used, which is a block code of the block substitution type where m bits are mapped into n bits for transmission. A vast number of other line codes or combinations of line codes and error correction codes exist that are equally effective. Any line codes that generate a power spectrum with little energy near DC could be used for direct conversion. For example, mB1C, mB1P, DmB1M and 2B1Q are some of the other codes that can be used. These codes and the methods of line coding are well known in the art of spectrum control in other contexts. See, for example, *Digital Communication,* Edward A. Lee and David G. Messerschmitt, Kluwer Academic Publishers, 1994.

In the system of FIG. 3 transmitter coder 96 is designed to substitute 4 bits for every 3 bits. The 1-bit redundancy is built into the code to provide the low-energy spectral component near DC. Typically, such substitution is performed by a translation table. See, for example, Brooks, R. M. and Jessop, A. (1983) "Line coding for optical fibre systems," *International Journal of Electronics,* vol. 55, no. 1, 81–120; and Sharland, A. J. and Stevenson, A. (1983) "A simple in-service error detection scheme based on the statistical properties of line codes for optical fibre systems," *International Journal of Electronics,* vol. 55, no 1, 141–58. The received signal is direct converted, passed through an analog filter to remove the low frequency components then sampled. Symbol-by-symbol decoder or MLSD or other decoding schemes could be performed to recover the transmitted data.

Figure 4:
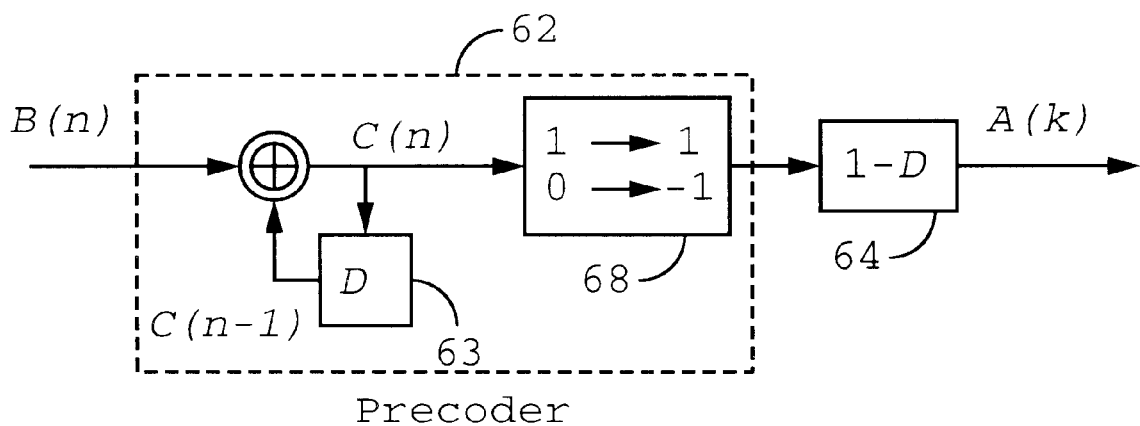
FIG. 4 is a block diagram of a coder used in an alternate embodiment of the invention.

In applications of the present invention where transmission bandwidth is at a premium, then one desires to avoid coding techniques that add to the required bandwidth. In this case, one may shape the signal to reduce the low-frequency signal-bearing spectral component without increasing the symbol rate by increasing the number of signal amplitude levels. An example of fixing the signal bandwidth and reducing the energy content near DC is the alternate mark inversion (AMI) code. In this code, the redundancy is introduced by expanding the number of transmitted signal levels, which also increases the transmit power. The signal spectrum modifier 96 for AMI code is shown in FIG. 4. The number of signal levels is increased to accommodate this code by introducing at the transmitter a 1-D filter 64. The intersymbol interference (ISI) introduced by filter 64 can be eliminated by precoder 62, but the expanded alphabet due to filtering increases the transmit power. By use of a maximum likelihood sequence detector (MLSD) at the decoder 104 of the receiver, however, the loss can be reduced to negligible amounts. Although an MLSD decoder contributes to hardware complexity, if error-correction codes (convolutional codes) are employed, the two could be combined. Further, an equalizer could be used in combination with the MLSD.

Figure 5:
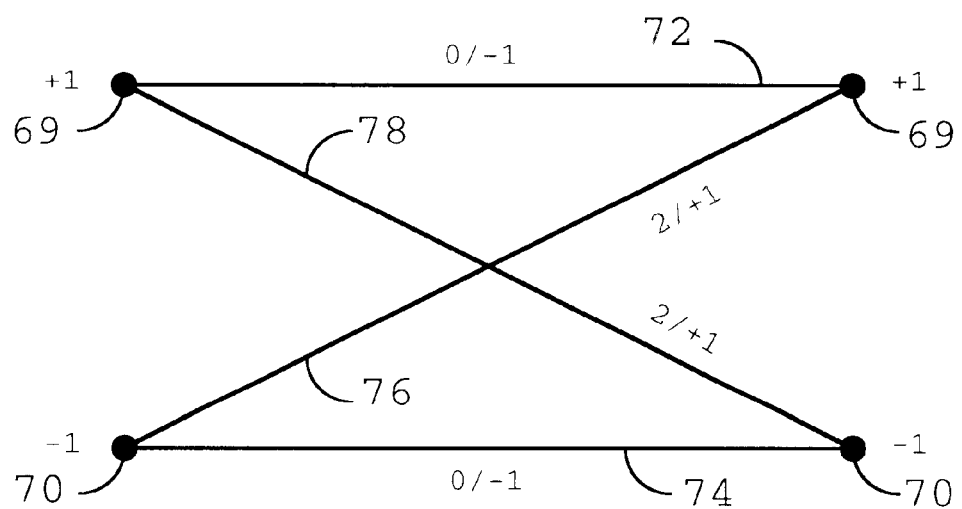
FIG. 5 is a trellis diagram used in a direct conversion receiver of the invention.

The coder 96 for AMI code first passes the bit stream B(n) through a precoder 62 prior to filter 64. Precoder 62 performs a logical XOR of B(n) with a delayed signal C(n-1) to produce signal C(n) which is then fed into antipodal signal converter 68, as well as into delay element 63. The antipode-converted signal is then passed through spectral shaping filter 64. The output of the filter, which appears memoryless because of the precoder, is then transmitted. After being filtered at the receiver end, the direct converted signal is sampled. The decoder 104 is an MLSD, which has a trellis diagram as shown in FIG. 5. States 69 and 70 correspond to whether the last channel input was a +1 or −1, respectively. Each of segments 72, 74, 76, and 78 between the states is characterized by a pair y/x which is used for MLSD, where y is the value the received signal should have been and x is the corresponding input signal value. Segments 72 and 74 have y/x=0/−1, and segments 76 and 78 have y/x=2/+1.

Although a binary line code is selected to demonstrate the advantages of the present invention, line codes for large alphabets with minimal energy at low frequencies could also be used. See, for example, A. R. Calderbrand and J. E. Mazo, "Spectral Nulls and Coding with Large Alphabets", *IEEE Communications Magazine,* December 1991.

In an alternate embodiment using direct conversion in spread spectrum applications, a pseudonoise sequence is modified so that a notch near DC is introduced. This is accomplished by using the fact that if the running digital sum (RDS) of a binary antipodal signal is bounded, a spectral null exists at DC. The goal in the design of a pseudonoise sequence for direct conversion is to find a sequence with a bounded RDS with as much randomness as possible. A simple approach is to alter an existing pseudonoise sequence with good auto- and cross-correlation properties by toggling bits that do not satisfy the RDS bound. An advantage of this approach is that some simple combinational logic at the output of the "standard" pseudonoise sequence generator is all the hardware overhead that is required. In most spread spectrum applications, partial auto-correlation and cross-correlation values determine the system performance. It can be shown by simulation that the increase in these correlation values are negligible when the simple approach described above is employed. In a data-driven spread spectrum communication, another constraint must be added to the simple approach described above: At the end of every data bit, the RDS of the modified pseudonoise must be forced to zero.

In other applications of the invention, it may be desirable to use other coding techniques. For example, vector coding or its variations (DMT, OFDM, etc) may be appropriate choices for certain circumstances. In this approach, the modulator creates a set of basis vectors that remains orthogonal after undergoing the dispersive effects of the channel and the low frequency filter, resulting in a set of N independent parallel channels. Spectral shaping is attained by appropriately allocating energy to this set of parallel channels.

It will be clear to one skilled in the art that the above embodiments may be altered in many ways without departing from the scope of the invention. In particular, the method of the invention may be used in wired or wireless communication systems and may be applied to any modulation scheme. In addition, any technique may be used for spectrum shaping; the invention is not limited to any specific coding scheme. Anyone of ordinary skill in the art will appreciate that the method may be used with direct conversion receivers whose specific designs differ from that described above, and it would be obvious in view of this disclosure how the invention may be implemented in these different cases. Accordingly, the present invention is not limited by the specifics used for illustrating the preferred embodiments of the invention, but encompasses all variations of the invention that fall within the scope of the following claims and their legal equivalents.

What is claimed is:

1. A receiver comprising:

a direct-converter for frequency-down-converting an RF passband signal directly to baseband to produce a baseband signal including zero frequency;

a filter connected to the direct-converter for reducing the energy of the baseband signal within a frequency notch including zero, producing a filtered signal; and a decoder connected to the filter for recovering an information signal from the filtered signal, wherein the decoder modifies the frequency spectrum of the filtered signal to recover low-frequency signal components.

2. The receiver of claim 1 wherein the decoder is a line decoder.

3. The receiver of claim 2 wherein the line decoder is an mBnB line decoder.

4. The receiver of claim 1 wherein the decoder is an amplitude decoder.

5. The receiver of claim 4 wherein the amplitude decoder is an alternate mark inversion decoder.

6. An RF communication system comprising:

a transmitter comprising a signal spectrum modification means for producing from an information bit stream B(n) a spectrum-modified signal A(k) having reduced energy within a low-frequency notch including zero; and a modulator means for modulating the spectrum-modified signal A(k) to generate an RF signal S(t);

a communication channel through which the RF signal S(t) passes, producing an RF signal R(t); and a receiver comprising a direct-converter circuit means for frequency down-converting the RF signal R(t) directly to baseband to produce a down-converted baseband signal; a low-frequency filter means for reducing the energy of the baseband signal within the low-frequency notch including zero to produce a filtered baseband signal A'(k); and a decoder means for modifying the frequency spectrum of the filtered baseband signal A'(k) to recover low-frequency signal components and produce a bit stream B'(n) corresponding to the bit stream B(n).

7. A method of RF communication comprising:

producing from an information bit stream B(n) a spectrum-modified signal A(k) having reduced energy within a low-frequency notch including zero;

modulating the spectrum-modified signal A(k) to generate an RF signal S(t);

passing the RF signal S(t) through an RF channel to produce an RF signal R(t);

frequency down-converting the RF signal R(t) directly to baseband to produce a down-converted baseband signal;

reducing the energy of the baseband signal within the low-frequency notch including zero to produce a filtered baseband signal A'(k); and modifying the frequency spectrum of the filtered baseband signal A'(k) to recover low-frequency signal components and produce a bit stream B'(n) corresponding to the bit stream B(n).

* * * * *